(12) United States Patent
Muchherla et al.

(10) Patent No.: US 11,475,969 B2
(45) Date of Patent: Oct. 18, 2022

(54) SCAN OPTIMIZATION USING DATA SELECTION ACROSS WORDLINE OF A MEMORY ARRAY

(71) Applicant: Micron Technology, Inc., Boise, ID (US)

(72) Inventors: Kishore Kumar Muchherla, Fremont, CA (US); Violante Moschiano, Avezzano (IT); Sead Zildzic, Rancho Cordova, CA (US); Junwyn A. Lacsao, Folsom, CA (US); Paing Z. Htet, Union City, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 54 days.

(21) Appl. No.: 17/247,633

(22) Filed: Dec. 18, 2020

(65) Prior Publication Data
US 2022/0199184 A1    Jun. 23, 2022

(51) Int. Cl.
*G11C 29/42* (2006.01)
*G11C 29/44* (2006.01)
*G11C 11/4074* (2006.01)
*G11C 11/408* (2006.01)
*G11C 29/50* (2006.01)

(52) U.S. Cl.
CPC .......... *G11C 29/42* (2013.01); *G11C 11/4074* (2013.01); *G11C 11/4085* (2013.01); *G11C 29/44* (2013.01); *G11C 29/50004* (2013.01)

(58) Field of Classification Search
CPC . G11C 29/42; G11C 11/4074; G11C 11/4085; G11C 29/44; G11C 29/50004
See application file for complete search history.

(56) References Cited

U.S. PATENT DOCUMENTS

| | | | |
|---|---|---|---|
| 9,978,456 B2 * | 5/2018 | Khandelwal | G11C 16/26 |
| 2015/0085575 A1 * | 3/2015 | Tam | G11C 29/50004 365/185.11 |
| 2018/0059968 A1 * | 3/2018 | Jung | G11C 5/148 |
| 2019/0371395 A1 * | 12/2019 | Lin | G11C 11/5628 |
| 2022/0044744 A1 * | 2/2022 | Wang | G11C 16/08 |

* cited by examiner

*Primary Examiner* — Tuan T Nguyen
(74) *Attorney, Agent, or Firm* — Lowenstein Sandler LLP

(57) ABSTRACT

A system includes a memory array with sub-blocks, each sub-block having groups of memory cells. A processing device, operatively coupled with the memory array, is to perform operations including performing, after a wordline is programmed through the sub-blocks, scanning of the wordline. The scanning includes selecting, to sample first data of the wordline, a first group of the groups of memory cells of a first sub-block of the sub-blocks; selecting, to sample second data of the wordline, a second group of the groups of memory cells of a second sub-block of the sub-blocks; concurrently reading the first data from the first group and the second data from the second group of the groups of memory cells; and performing an error check of the wordline using the first data and the second data.

18 Claims, 9 Drawing Sheets

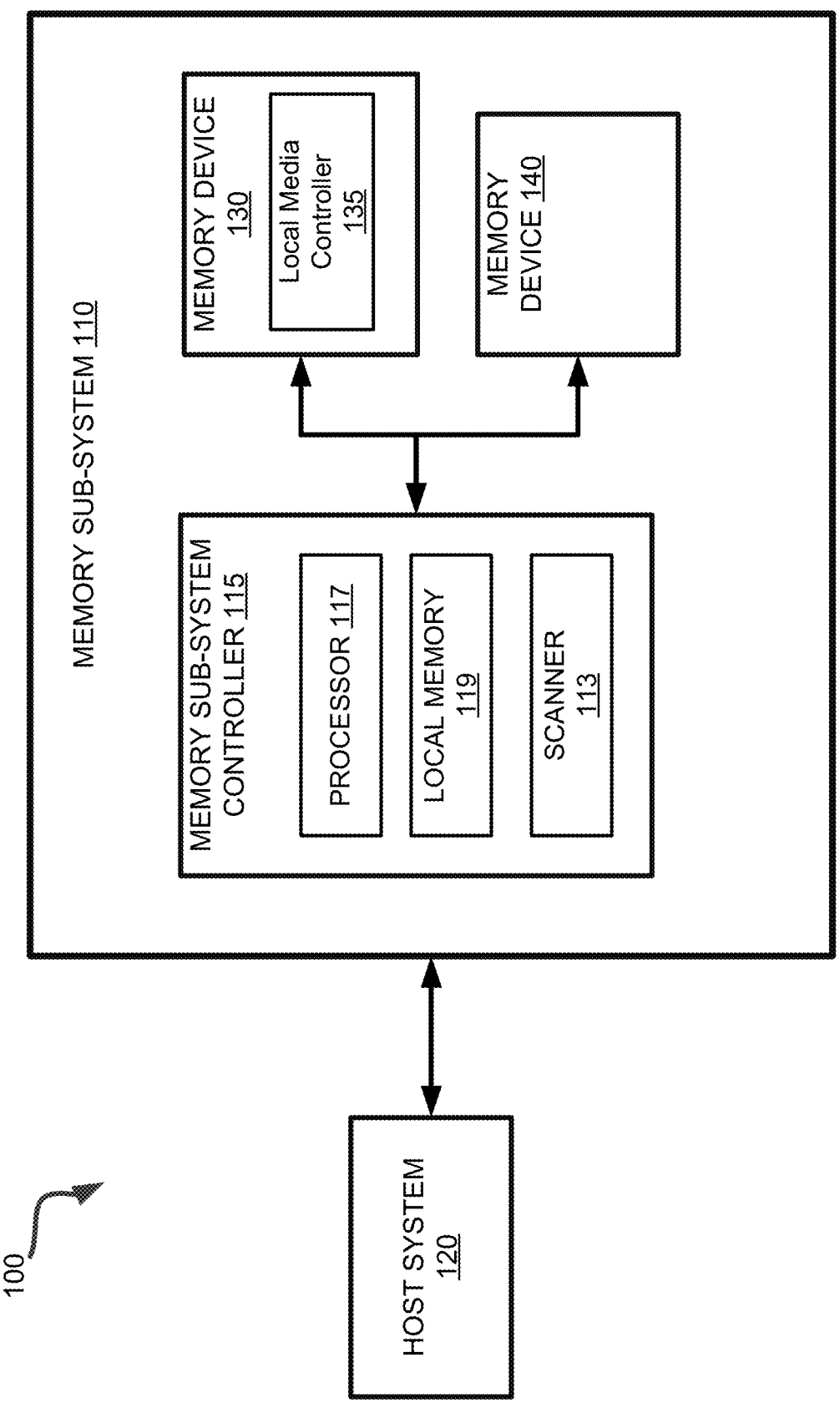

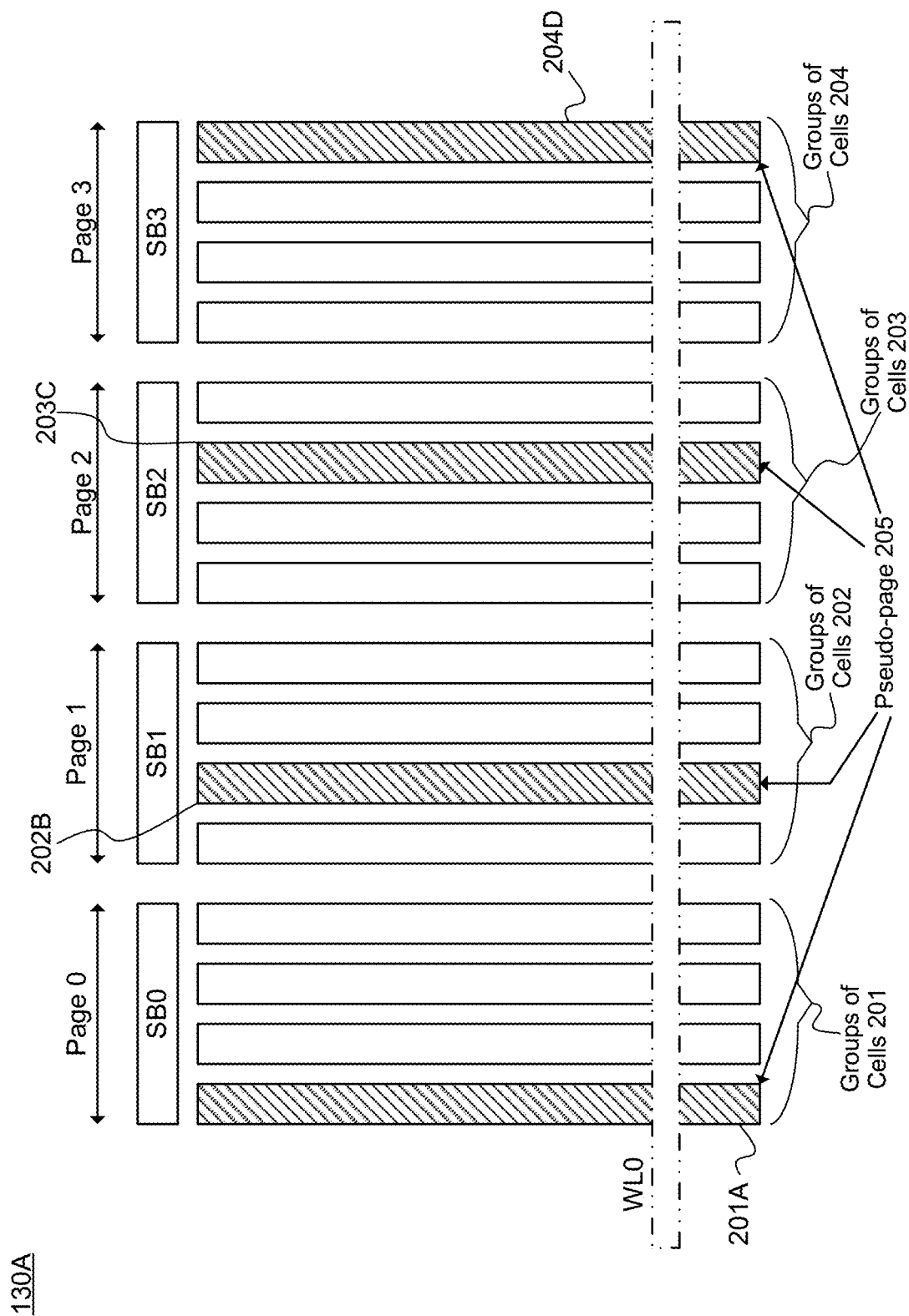

500

```
┌─────────────────────────────────────────────────────────────────────────┐
│ Select, to sample first data of the wordline, a first group of the groups of memory cells of a │
│                  first sub-block of multiple sub-blocks.                │
│                                    510                                  │
└─────────────────────────────────────────────────────────────────────────┘
                                     │
                                     ▼
┌─────────────────────────────────────────────────────────────────────────┐
│ Select, to sample second data of the wordline, a second group of the groups of memory │
│           cells of a second sub-block of the multiple sub-blocks.       │
│                                    520                                  │
└─────────────────────────────────────────────────────────────────────────┘
                                     │
                                     ▼
┌ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐
│ Select, to sample third data of the wordline, a third group of the groups of memory cells of │
│                  a third sub-block of the multiple sub-blocks.          │
│                                    530                                  │
└ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘
                                     │
                                     ▼
┌ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐
│ Select, to sample fourth data of the wordline, a fourth group of the groups of memory cells │
│                of a fourth sub-block of the multiple sub-blocks.        │
│                                    540                                  │
└ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘
                                     │
                                     ▼
┌─────────────────────────────────────────────────────────────────────────┐
│ Concurrently read the first data, the second data, and optionally, the third data, and the │
│                                 fourth data.                            │
│                                    550                                  │
└─────────────────────────────────────────────────────────────────────────┘
                                     │
                                     ▼
┌─────────────────────────────────────────────────────────────────────────┐
│  Perform the error check of the wordline using the first data, the second data, and │
│             optionally, the third data, and the fourth data.           │
│                                    560                                  │
└─────────────────────────────────────────────────────────────────────────┘
```

SCAN OPTIMIZATION USING DATA SELECTION ACROSS WORDLINE OF A MEMORY ARRAY

TECHNICAL FIELD

Embodiments of the disclosure are generally related to memory sub-systems, and more specifically, relate to scan optimization using data selection across wordline of a memory array.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 1 illustrates an example computing system that includes a memory sub-system in accordance with some embodiments.

FIG. 2A is an example schematic diagram of data selection from multiple sub-blocks of a wordline for performing scanning of the wordline, in accordance with some embodiments.

FIG. 5 is a flow diagram of an example method of selecting data from multiple sub-blocks of a wordline for performing scanning of the wordline, in accordance with some embodiments.

DETAILED DESCRIPTION

Figure 2B:
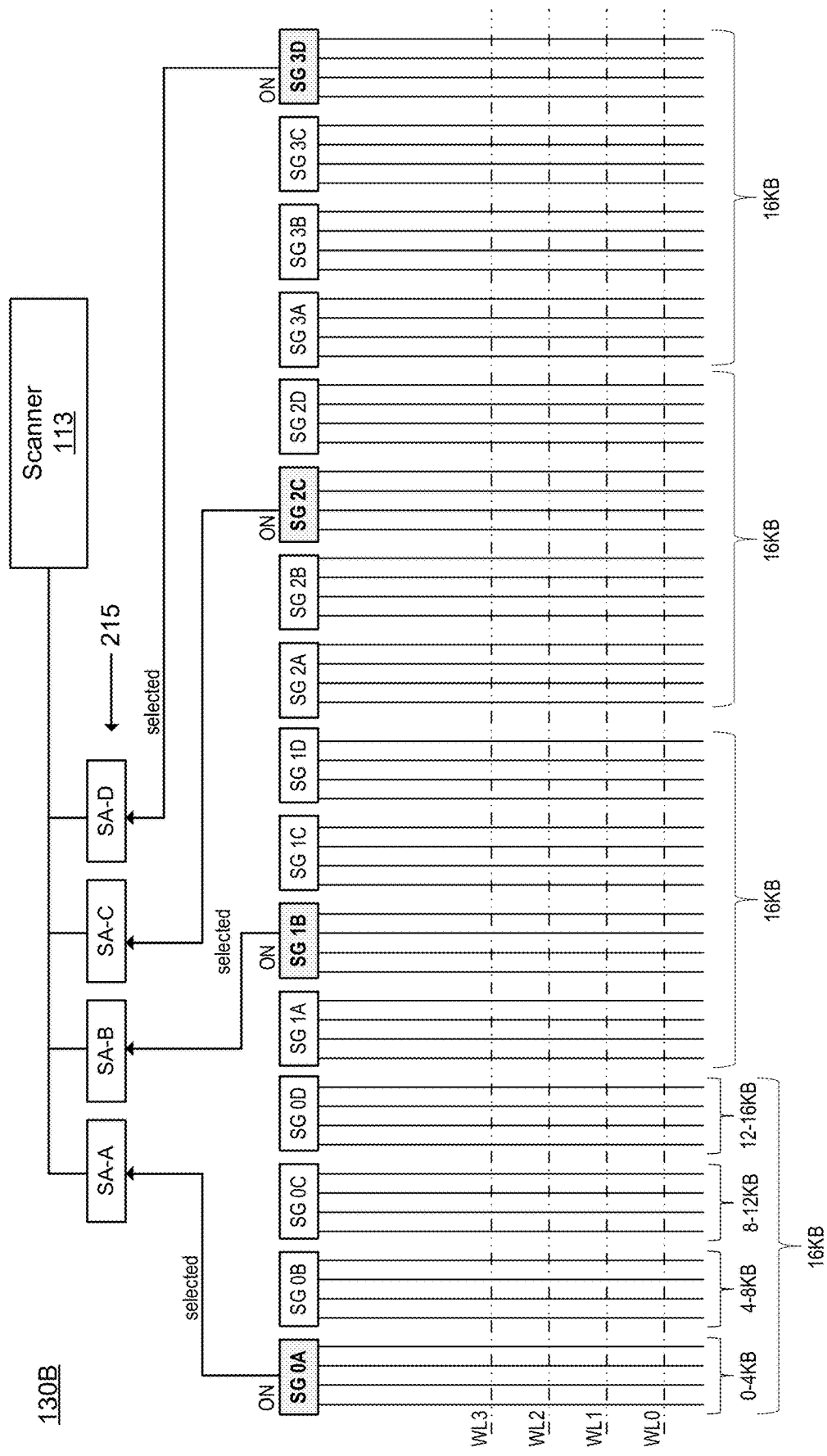
FIG. 2B is a further example schematic diagram of data selection from multiple sub-blocks of a wordline for performing scanning of the wordline, in accordance with some embodiments.

Embodiments of the present disclosure are directed to scan optimization using data selection across wordline of a memory array. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid, also referred to as a memory array. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

Various access operations can be performed on the memory cells. For example, data can be written to, read from, and erased from memory cells. Memory cells can be grouped into a write unit, such as a page. For some types of memory devices, a page is the smallest write unit. A wordline can have multiple pages on the same wordline grouped as sub-blocks. On sub-block is typically accessed at any given time. Although each sub-block has its own set of bitlines, the sub-blocks share a common page buffer or sense-amplifier.

In conventional memory systems, such as NAND, the controller (e.g., processing device) uses scans to check the integrity of the pages. These pages are marked by sub-block boundary per wordline, and are thus referred to hereinafter as sub-blocks. Because defects can manifest themselves local to a sub-block, defect or non-defect scans are performed on each individual sub-block of a wordline. For example, data can be read from each sub-block of the wordline in turn and an error check performed on the data. Scans can be performed in conjunction with temporary RAIN parity scheme (e.g., outside of a defect blast radius in the case of a defect that is detected), other types of error detection, and/or for detection of intrinsic stresses of memory cells of each sub-block, in the case of non-defect scans. If the scanned sub-blocks are error free, their integrity is intact and no corrective action need be taken. Performing scanning of each sub-block of the wordline requires significant processing overhead, and is thus costly. For example, such scanning consumes resources of the memory sub-system controller and bandwidth of a local media controller of the memory device (e.g., NAND).

Aspects of the present disclosure address the above and other deficiencies through, when performing scanning of a memory device, selecting particular groups of memory cells in each sub-block of multiple sub-blocks of the wordline from which to sample data, and performing error checks on the sampled data. In one embodiment, each group of memory cells corresponds to a bitline or column in the memory array. The selected groups of memory cells across the multiple sub-blocks can, for example, be sequentially numbered to vary the selected groups of memory cells from each respective sub-block. Other types of rotating numbering schemes for the sampled groups of memory cells are envisioned. In one embodiment, a group of sense amplifiers that are multiplexed across the sub-blocks (e.g., to read each sub-block one at a time) is repurposed so that each sense amplifier of the group of sense amplifiers samples different groups of memory cells from each respective sub-block of the multiple sub-blocks. In this way, a type of pseudo-page is selected across the multiple sub-blocks to be read at the same time (e.g., concurrently), thus reducing the overhead costs associated with multiple reads of individual sub-blocks, and corresponding error check of each sub-block. Because at least a chunk of data is sampled form each sub-block, all of the multiple sub-blocks are effectively scanned as a set, e.g., pseudo-page.

In an alternative embodiment, repurposing of the sense amplifiers to sample groups of memory cells across multiple sub-blocks may not be possible where each entire sub-block shares a select gate enable signal with respect to the group of sense amplifiers. In such embodiments, a wordline is selected from potentially hundreds of wordlines, and is caused to be programmed with a mask. The mask can result in the selected groups of memory cells from each respective sub-block of the multiple sub-blocks being programmed at a first voltage level and the remainder of the groups of memory cells of the multiple sub-blocks being programmed with at a second voltage level. In one embodiment, the first voltage level is lower than the second voltage level, although the opposite can be true in another embodiment.

In the alternative embodiment, when scanning is performed on a second wordline (or some wordline other than the mask wordline) that is coupled to the mask wordline, the processing device causes a custom wordline voltage to be applied to the second wordline. The custom wordline voltage is adapted to select groups of memory cells across the multiple sub-blocks of the second wordline corresponding to those of the mask wordline programmed to the first voltage level, and to unselect groups of memory cells of the multiple sub-blocks corresponding to those of the mask wordline programmed to the second voltage level. The processing device can then concurrently read data from the selected groups of the memory cells of the second wordline and ignore data from the unselected groups of the memory cells. The processing device can then perform an error check of the wordline using the data concurrently read from the selected groups of the memory cells. In this way, the select gate enable signal is bypassed and the multiple sub-blocks are sampled as before, and as will be discussed, with reference to the first embodiment for purposes of error detection.

Therefore, advantages of the systems and methods implemented in accordance with some embodiments of the present disclosure include, but are not limited to, significantly reducing (e.g., by around 75%) the overhead costs of reading data of each individual sub-block (e.g., page) by instead sampling only a group of memory cells from each sub-block when performing scanning. The principles of the present disclosure reduce the number of read operations required to perform scanning of each wordline, and also reduces the amount of data required to be processed during error checking of the data read from the wordline. Not only are resources reduced that are required of the memory sub-system controller to perform the scanning, but bandwidth consumption by a local media controller of the memory device is also reduced. Other advantages will be apparent to those skilled in the art of scanning of programmed wordlines within a memory sub-system discussed hereinafter.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the controller 115 includes a scanner 113 that performs the data selections across the wordlines and the scanning described herein. The scanner 113 can also include, for example, an error-correcting code (ECC) encoder/decoder. The ECC encoder/decoder can perform ECC encoding for data written to wordlines of the memory devices 130 and ECC decoding for data read from the wordlines of the memory devices 130, respectively. The ECC decoding can be performed to decode an ECC codeword to correct errors in the raw read data, and in many cases also to report the number of bit errors in the raw read data. The scanner can take other corrective actions as well in response to error detection. In alternative embodiments, the control logic of the scanner 113 is at least partially also located within the local media controller 135 of the memory device 130.

FIG. 2A is an example schematic diagram of data selection from multiple sub-blocks of a wordline for performing scanning of the wordline, in accordance with some embodiments. In one embodiment, a memory portion 130A of the memory device 130 contains multiple pages (e.g., page 0, page 1, page 2, page 3) corresponding to multiple sub-blocks (e.g., SB0, SB1, SB2, SB3, respectively). The memory portion 130A is illustrated as having four sub-blocks, but fewer or more sub-blocks can define a wordline (WL0) in different embodiments. Each sub-block SB0, SB1, SB2, and SB3 includes multiple groups of cells 201, 202, 203, and 204, respectively.

In some embodiments, the controller 115 (e.g., processing device) selects, to sample first data of the wordline (WL0), a first group 202A of the groups of memory cells 201 of a first sub-block (SB0) of the multiple sub-blocks. The controller 115 further selects, to sample second data of the wordline (WL0), a second group 202B of the groups of memory cells 202 of a second sub-block (SB1) of the plurality of sub-blocks. The controller 115 further selects, to sample third data of the wordline (WL0), a third group of the groups of memory cells 203 of a third sub-block (SB2) of the multiple of sub-blocks. The controller further selects, to sample fourth data of the wordline (WL0), a fourth group of the groups of memory cells 204 of a fourth sub-block (SB3) of the multiple sub-blocks.

In this way, the selected group of memory cells in each sub-block is staggered across respective groups of cells of each respective sub-block. While the illustrated embodiment staggers the selected group of cells sequentially, e.g., the first group, the second group, the third group, and the fourth group of memory cells 201A, 202B, 203C, and 204D, other embodiments can stagger the selected group of memory cells in different way, including randomly. In the embodiment of FIG. 2A, the controller 115 can further concurrently read the first data, the second data, the third data, and the fourth data, and perform an error check of the wordline using the first data, the second data, the third data, and the fourth data to complete performance of the scanning of the wordline (WL0).

FIG. 2B is a further example schematic diagram of data selection from multiple sub-blocks of a wordline for performing scanning of the wordline, in accordance with some embodiments. In another embodiment, a memory portion 130B of the memory device 130 contains multiple pages corresponding to multiple sub-blocks. In one embodiment, the memory portion 130B is a more-detailed version of the memory portion 130A discussed with reference to FIG. 2A. The memory portion 130A is illustrated as having four sub-blocks (numbered 0, 1, 2, and 3 for purposes of explanation), but fewer or more sub-blocks can define multiple wordlines (WL0 . . . WL3) in different embodiments. The memory portion 130A can be understood to illustrate one implementation in which each sub-block is 16 kilobytes (KB) in size, which includes four groups of memory cells, each being 4 KB in size, but different sizes of each sub-block and each group of sub-blocks are envisioned.

In various embodiments, each group of memory cells includes a select gate that can be separately enabled (e.g., turned ON) to read the data of the group of memory cells at once or disabled (e.g., turned OFF) to prevent reading any data. Thus, for example, the first sub-block includes a first select gate (SG 0A), a second selected gate (SG 0B), a third select gate (SG 0C), and a fourth select gate (SG 0D), respectively for first groups of memory cells. Further, the second sub-block includes a first select gate (SG 1A), a second selected gate (SG 1B), a third select gate (SG 1C), and a fourth select gate (SG 1D), respectively for second groups of memory cells. Additionally, the third sub-block includes a first select gate (SG 2A), a second selected gate (SG 2B), a third select gate (SG 2C), and a fourth select gate (SG 2D), respectively for third groups of memory cells. Finally, the fourth sub-block includes a first select gate (SG 3A), a second selected gate (SG 3B), a third select gate (SG 3C), and a fourth select gate (SG 3D), respectively for fourth groups of memory cells.

In the embodiments of FIG. 2B, the memory portion 130B includes four sense amplifiers 215 that can read a sub-block of data at a time. In order to stagger the sub-block of data across a wordline when performing a scan of that wordline, the scanner 113 can selectively enable (or disable) the first select gate (SG 0A) of the first sub-block, the second select gate (SG 1B) of the second sub-block, the third select gate (SG 2C) of the third sub-block, and the fourth select gate (SG 3D) of the fourth sub-block, to concurrently read the data from the first group of memory cells of the first sub-block, the second group of memory cells of the second sub-block, the third group of memory cells of the third sub-block, and the fourth group of memory cells of the fourth sub-block, respectively. The concurrent scan of 4 KB groups of memory cells from different sub-blocks replace four separate read operations, one on each sub-block of the four sub-blocks. This reduction of scanning reduces read overhead by 75%.

In this way, the groups of memory cells that are selected are staggered sequentially across the four sub-blocks of the wordlines being scanned for defects. The enablement of the select gates by the scanner 113 can be performed via the respective sense amplifiers SA-A, SA-B, SA-C, and SA-D, which can be multiplexed, one for the select gates of each sub-block of the four sub-blocks. In other embodiments, the selections of the groups of memory cells is in reverse sequential order or ordered differently, including randomly, across the groups of memory cells. Thus, the embodiment of sequentially selecting the groups of memory cells across the multiple sub-blocks is for ease of illustration and explanation.

Figure 3A:
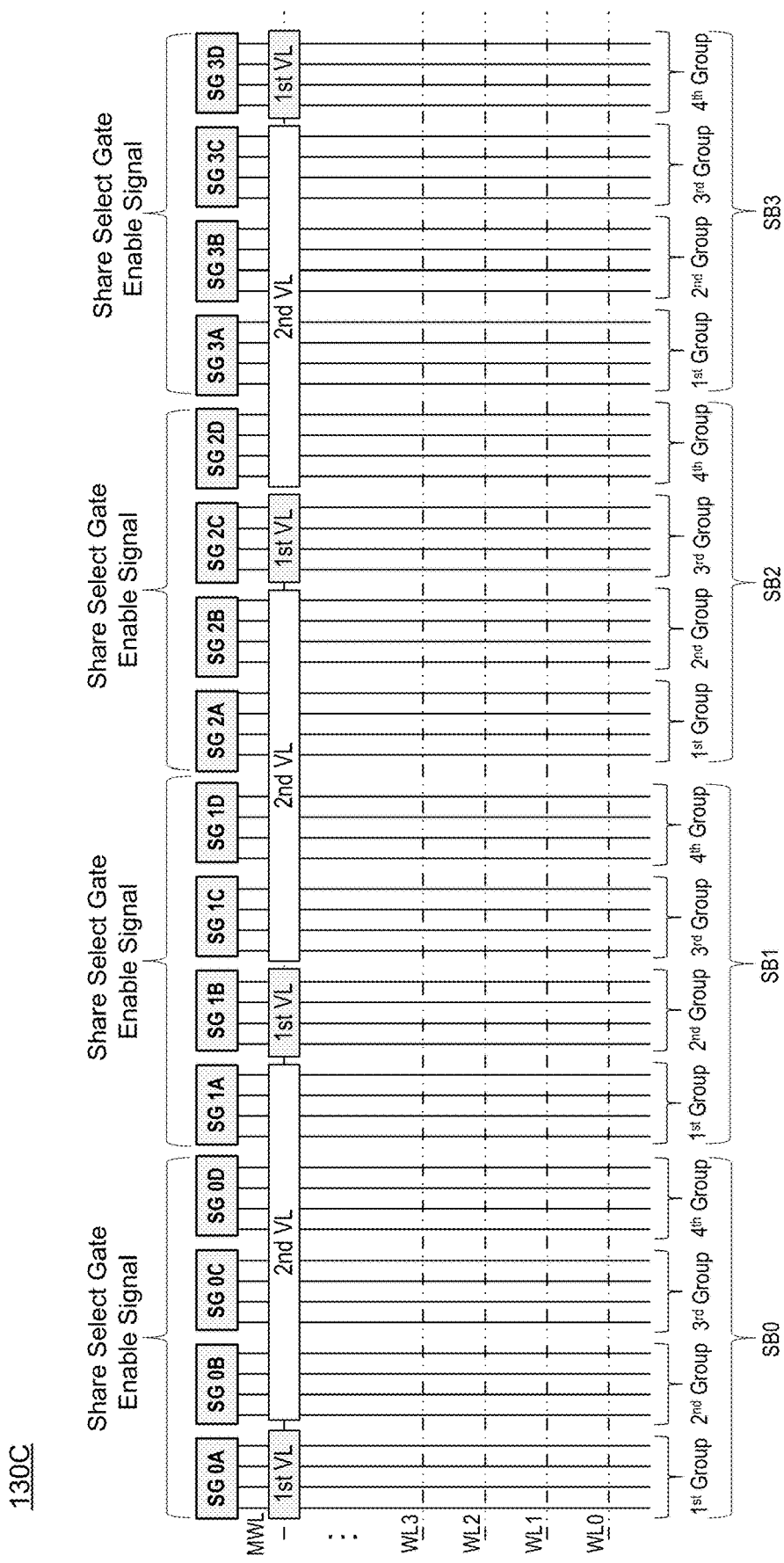
FIG. 3A is an example schematic diagram of using a mask wordline for data selection from multiple sub-blocks of a wordline for performing scanning of the wordline, in accordance with some embodiments.

FIG. 3A is an example schematic diagram of using a mask wordline for data selection from multiple sub-blocks of a wordline for performing scanning of the wordline, in accordance with some embodiments. According to a further embodiment, in a memory portion 130C of the memory device 130, there is a common select gate enable signal that enables (turns ON) each of the select gates of a sub-block, e.g., enable signals VSG0, VSG1, VSG2 in FIG. 3B. Therefore, the scanner 113 can either turn all of the groups of memory cells ON or all of the groups of memory cells OFF for a particular sub-block. This shared select gate enable signal architecture makes the implementations described with reference to FIGS. 2A-2B not possible.

To provide an alternative embodiment in this type of architecture, the scanner 113 can cause a wordline (MWL) to be programmed with a mask. To program the mask wordline (MWL), control logic of the memory device 130 causes to be programmed, to a first voltage level ($1^{st}$ VL), each respective of the groups of memory cells that alternate across the wordline. Thus, the memory device 130 directed to program the mask can program, to the first voltage level, a first group ($1^{st}$ Group) of the groups of memory cells of a first sub-block (SB0) of the multiple sub-blocks, a second group ($2^{nd}$ Group) of the groups of memory cells of a second sub-block (SB1) of the multiple sub-blocks, a third group ($3^{rd}$ Group) of the groups of memory cells of a third sub-block (SB2) of the multiple sub-blocks, and a fourth group ($4^{th}$ Group) of the groups of memory cells of a fourth sub-block (SB3) of the multiple sub-blocks. Again, while the first group, the second group, the third group, and the fourth group of the groups of memory cells selected across the four sub-blocks (SB0, SB1, SB2, SB3) are sequentially numbered, other embodiments select the groups of memory cells in reverse sequence, randomly, or other order. The memory device 130, as part of programming the mask, further causes a reminder of the groups of memory blocks to be programmed to a second voltage level.

In a first embodiment, the first voltage level is a low (e.g., digital "0") voltage level and the second voltage level is a high (e.g., digital "1") voltage level, although different voltages values are envisioned where the second voltage level is higher than the first voltage level. The low voltage level causes the gate at that cell to turn ON and thus pass data while a high voltage level causes the gates to be turned OFF and thus act as an open circuit. In a second embodiment, the first voltage level is a high voltage level and the second voltage level is a low voltage level, where the select gates cause switching opposite to that of the first embodiment.

When a wordline is to be scanned, the controller 115 can cause a custom wordline voltage to be applied to the wordline (e.g., WL0, WL1, WL2, WL3, or the like). The custom wordline voltage can be adapted to select groups of memory cells corresponding to those of the mask wordline programmed to the first voltage level, and to unselect groups of memory cells corresponding to those of the mask wordline programmed to the second voltage level. As illustrated, the darkened "$1^{st}$ VL" groups of memory cells are thus selected and the lighter "$2^{nd}$ VL" groups of memory cells are unselected. This means that 75% of the groups of memory cells across the multiple sub-blocks are not selected. The controller 115 can further concurrently read data from the selected groups of memory cells of the second wordline, while the unselected groups of memory cells are not read because they are open circuits. The controller 115 can then perform, using the data, an error check of the second wordline.

Figure 3B:
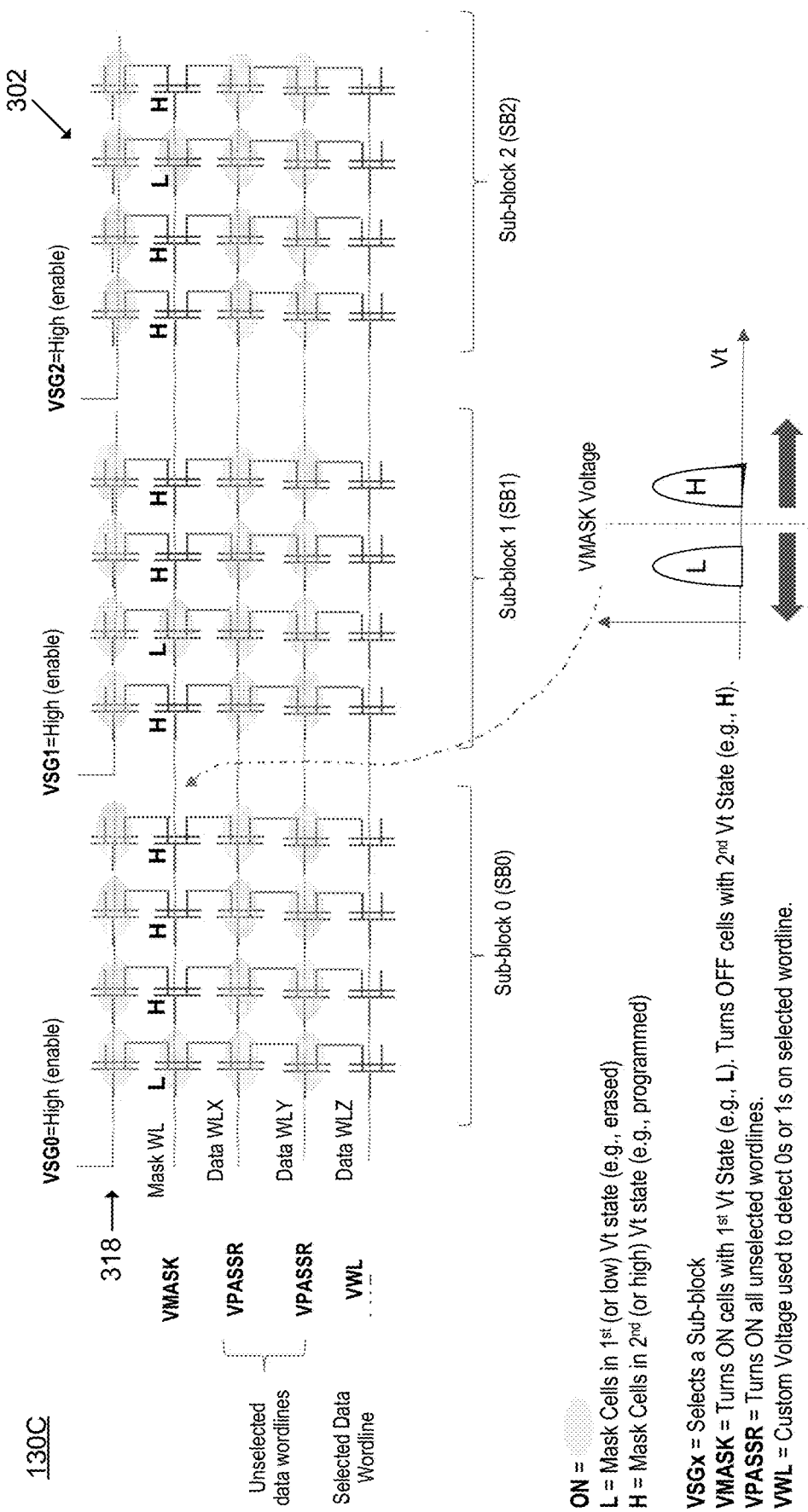
FIG. 3B is an example gate diagram version of the schematic diagram of FIG. 3A, in accordance with an embodiment.

FIG. 3B is an example gate diagram version of the schematic diagram of FIG. 3A, in accordance with an embodiment. This schematic diagram illustrates three sub-blocks of the memory portion 103C of FIG. 3A for purposes of illustration, namely the first sub-block (SB0), the second sub-block (SB1), and the third sub-block (SB2). A row of sets of switches 318 (e.g., transistors) in a memory array 302 include the select gates referred to previously as SG0A SG0D, SG1A SG1D, and SG2A SG2D that selectively enable reading data from the respective groups of memory cells of these sub-blocks. The set of switches 318 for the first sub-block (SB0) is turned ON by a VSG0 gate enable signal, the set of switches for the second sub-block (SB1) is turned ON by a VSG1 gate enable signal, and the set of switches for the third sub-block (SB0) is turned ON by a VSG2 gate enable signal, where VSGx turns on a specific sub-block designated by "x." In this way, the set of switches 318 can enable and disable access to each of the groups of memory cells with which the set of switches 318 are coupled.

In various embodiments, the mask wordline (Mask WL) is programmed as discussed with reference to FIG. 3A (with low voltage level as a bolded L and high voltage level as a bolded H) and coupled to each set of switches 318. The patterned mask programmed into the mask wordline can act as a next layer of selector signals to enable (or activate) sampled selection of varying groups of memory cells across the multiple sub-blocks.

In these embodiments, the multiple sub-blocks of the mask wordline are coupled between each set of switches 318 and the multiple sub-blocks of a second wordline, e.g., the selected data wordline (WLZ) to which the custom wordline voltage (VWL) is applied. Unselected data wordlines (WLX, WLY) can have a conventional voltage applied (VPASSR), which turns ON the unselected wordlines normally. Selected wordlines are selected for scanning while unselected wordlines are enabled to ensure the unselected wordline turned ON and transistors on selected wordlines behave as transparent devices.

In various embodiments, after the remaining wordlines are programmed and scanned, the unmasked portion of the mask wordline (MWL) can be programmed with user data. In other words, after performing the scanning of the multiple wordlines of which the memory array is a part, the controller 115 can cause the unselected groups of memory cells to be programmed with data (such as user data). Using this approach, instead of wasting a full wordline for the mask, the portion of the wordline can be recovered to stored user data, thus avoiding wasting 75% of the mask wordline.

Figure 4A:
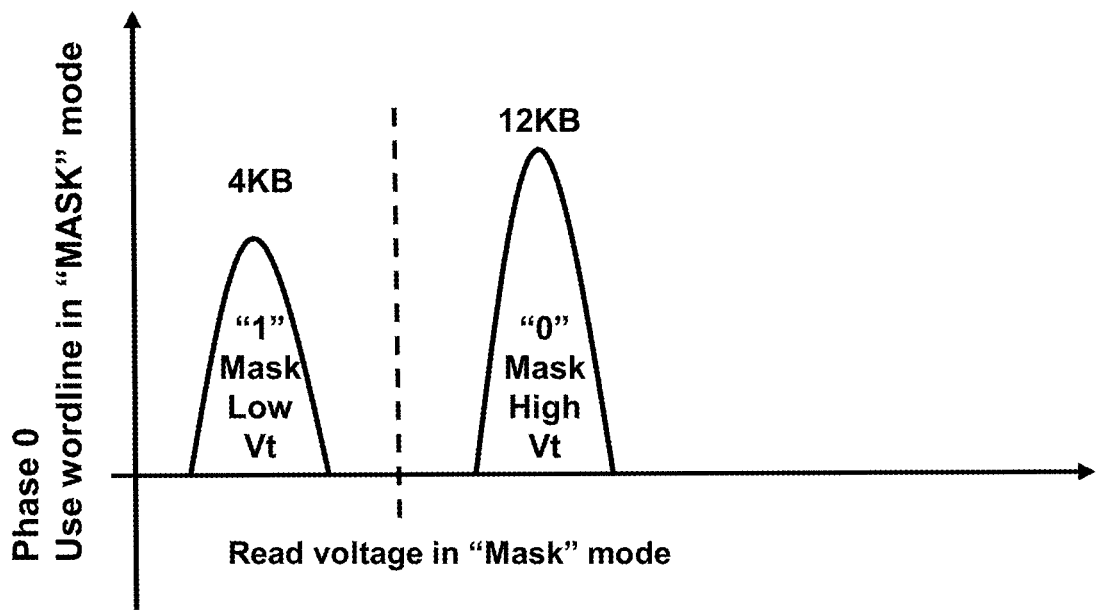
FIG. 4A is a graph illustrating a first set of read voltage levels employed in a mask mode for writing a memory array, in accordance with an embodiment.

FIG. 4A is a graph illustrating a first set of read voltage levels employed in a mask mode for writing to the memory array 302, in accordance with an embodiment. As discussed with reference to FIGS. 3A-3B, the low voltage level can correspond to the selected portion of the mask wordline while the high voltage level can correspond to the unselected portions of the mask wordline (although these voltage levels can be reversed to encode the opposite selections in other embodiments). In one embodiment, the portions of the mask that are erased or programmed to the low voltage level is 4 KB per sub-block and the portions of the mask that are programmed high is 12 KB per sub-block.

Figure 4B:
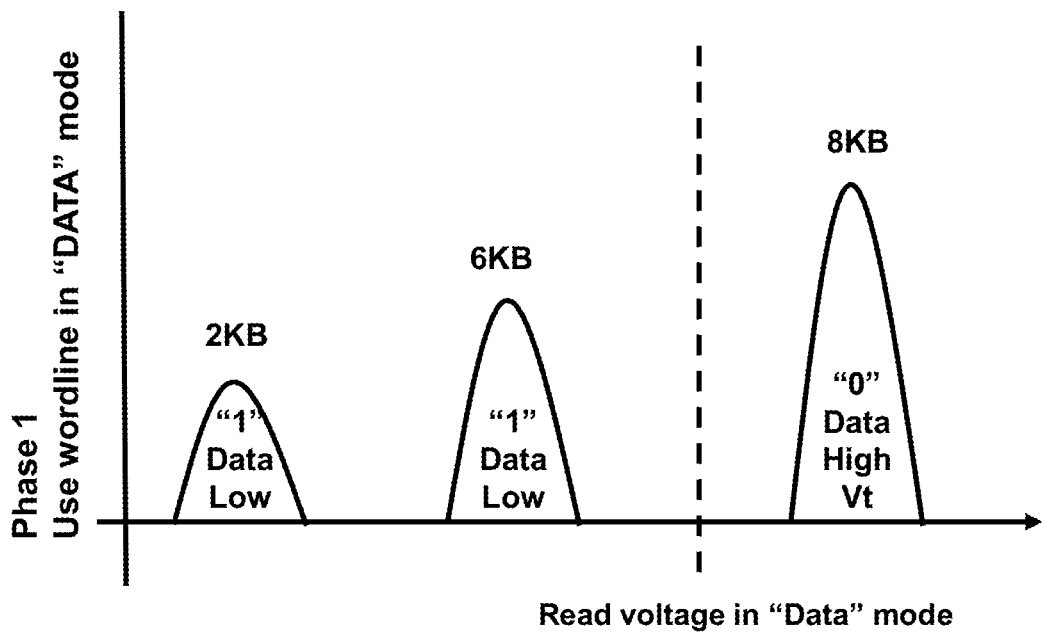
FIG. 4B is graph illustrating a second set of read voltage levels employed in a data mode for writing a memory array, in accordance with an embodiment.

Until the remaining wordlines are programmed and scanned, the data wordline can be used in the mask mode providing the template for the custom wordline voltage, as discussed. Before the physical block is closed (of which the sub-blocks are a part), the controller 115 can cause the memory device 130 to switch to a data mode for programming the mask wordline, in which the voltage threshold (Vt) definitions are changed to correspond normal data levels. FIG. 4B is graph illustrating a second set of read voltage levels employed in a data mode for writing a memory array, in accordance with an embodiment, only for purposes of exemplary explanation. In the illustrated embodiment, there are three data voltage levels, namely a first low data voltage level for 2 KB of memory cells per sub-block, a second low voltage level for 6 KB of memory cells per sub-block, and a high voltage level for 8 KB of memory cells per sub-block.

Thus, in some embodiments, the controller 115 causes a memory device 130 containing the memory array 302 to operate in a mask mode while performing the scanning on multiple wordlines of which the memory array is a part, where the first voltage level is at a first threshold voltage level and the second voltage level is at a second threshold voltage level. IN these embodiments, the controller 115 further causes the memory device 130 to operate in a data mode after completion of the scanning. The data mode causes the memory cells of the first wordline to be programmed with a set of threshold voltage levels designed for subsequent read operations at multiple data levels different than the first and second threshold voltage levels, e.g., meant for normal read operations.

FIG. 5 is a flow diagram of an example method 500 of selecting data from multiple sub-blocks of a wordline for performing scanning of the wordline, in accordance with some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the scanner 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic selects, to sample first data of a wordline, a first group of the groups of memory cells of a first sub-block of multiple sub-blocks.

At operation 520, the processing logic selects, to sample second data of the wordline, a second group of the groups of memory cells of a second sub-block of the multiple sub-blocks.

At operation 530, the processing logic optionally also selects, to sample third data of the wordline, a third group of the groups of memory cells of a third sub-block of the multiple sub-blocks.

At operation 540, the processing logic optionally also selects, to sample fourth data of the wordline, a fourth group of the groups of memory cells of a fourth sub-block of the multiple sub-blocks.

At operation 550, the processing logic concurrently reads the first data from the first group, the second data from the second group of the groups of memory cells, and optionally also the third data from the third group and the fourth data from the fourth group of memory cells across the wordline.

At operation 560, the processing logic performing an error check of the wordline using the first data, the second data, and optionally also using the third data and the fourth data. The method 500 can further includes taking a corrective action in response to detecting a defect in the wordline based on results of the error check.

Figure 6:
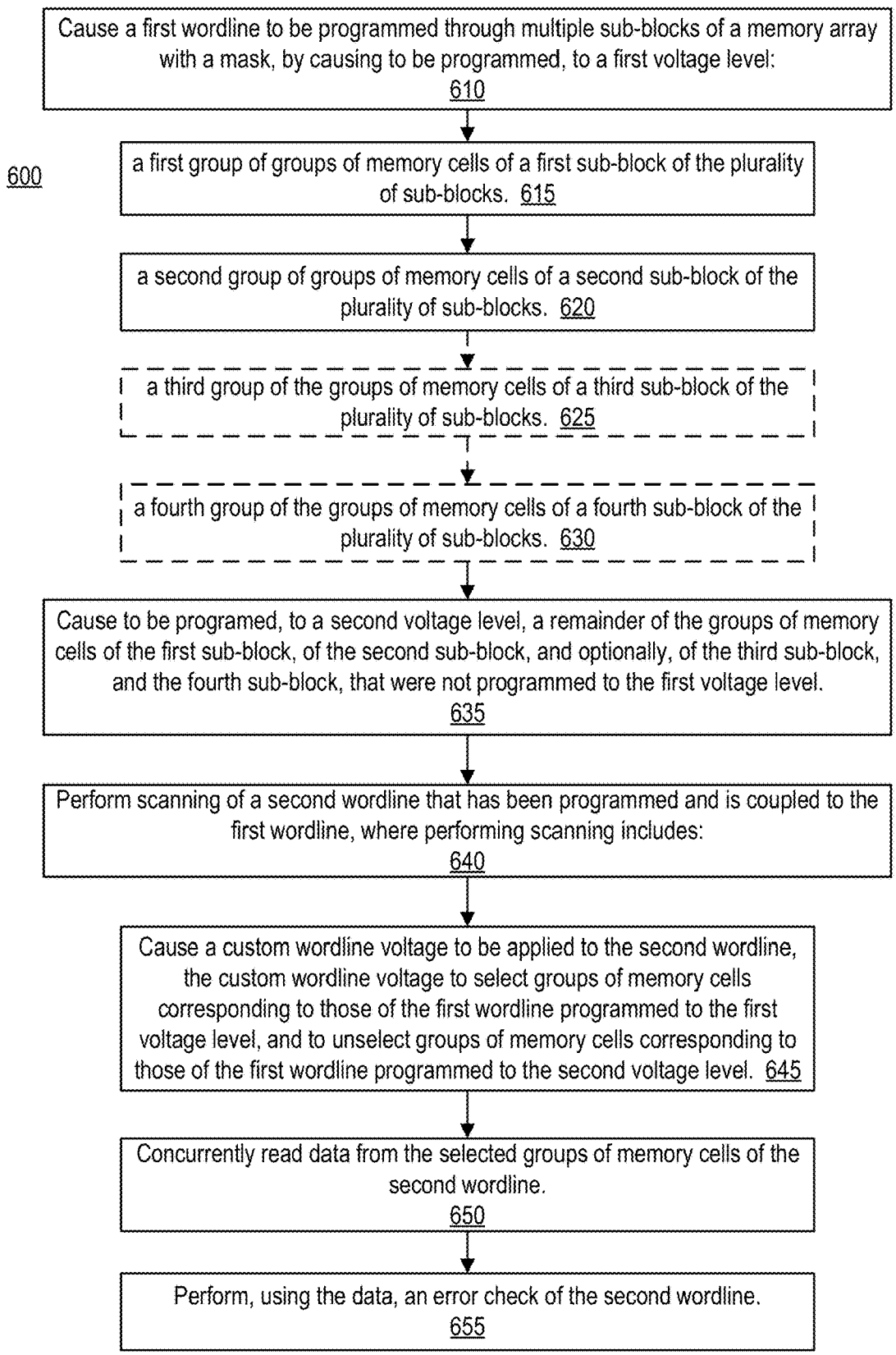
FIG. 6 is a flow diagram of an example method of employing a mask for selecting data from multiple sub-blocks of a wordline for performing scanning of the wordline, in accordance with some embodiments.

FIG. 6 is a flow diagram of an example method 600 of employing a mask for selecting data from multiple sub-blocks of a wordline for performing scanning of the wordline, in accordance with some embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the scanner 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic causes a first wordline to be programmed through a plurality of sub-blocks of a memory array with a mask by causing to be programmed two or more of groups of memory cells, including, at operation 615, a first group of groups of memory cells of a first sub-block of the plurality of sub-blocks, and at operation 620, a second group of groups of memory cells of a second sub-block of the plurality of sub-blocks. The programming of the mask can be optionally extended by causing to be programmed, to the first voltage level, at operation 625, a third group of the groups of memory cells of a third sub-block of the plurality of sub-blocks, and at operation 630, a fourth group of the groups of memory cells of a fourth sub-block of the plurality of sub-blocks. The optional programming of the third group and the fourth group of memory cells is indicated by dashed lines.

At operation 635, the programming of the mask further includes the processing logic causing to be programmed, to a second voltage level, a remainder of the groups of memory cells of the first sub-block, of the second sub-block, and optionally also of the third block and the fourth block, that were not programmed to the first voltage level.

At operation 640, the processing logic performs scanning of a second wordline that has been programmed and is coupled to the first wordline. Performing the scanning can be carried out in operations 645, 650, and 655.

At operation 645, the processing logic causes a custom wordline voltage to be applied to the second wordline. The custom wordline voltage can select groups of memory cells corresponding to those of the first wordline programmed to the first voltage level, and unselect groups of memory cells corresponding to those of the first wordline programmed to the second voltage level.

At operation 650, the processing logic concurrently reads data from the selected groups of memory cells of the second wordline performed at operation 645.

At operation 655, the processing logic performs, using the data, an error check of the second wordline. The method 600 can further includes taking a corrective action in response to detecting a defect in the second wordline based on results of the error check.

Figure 7:
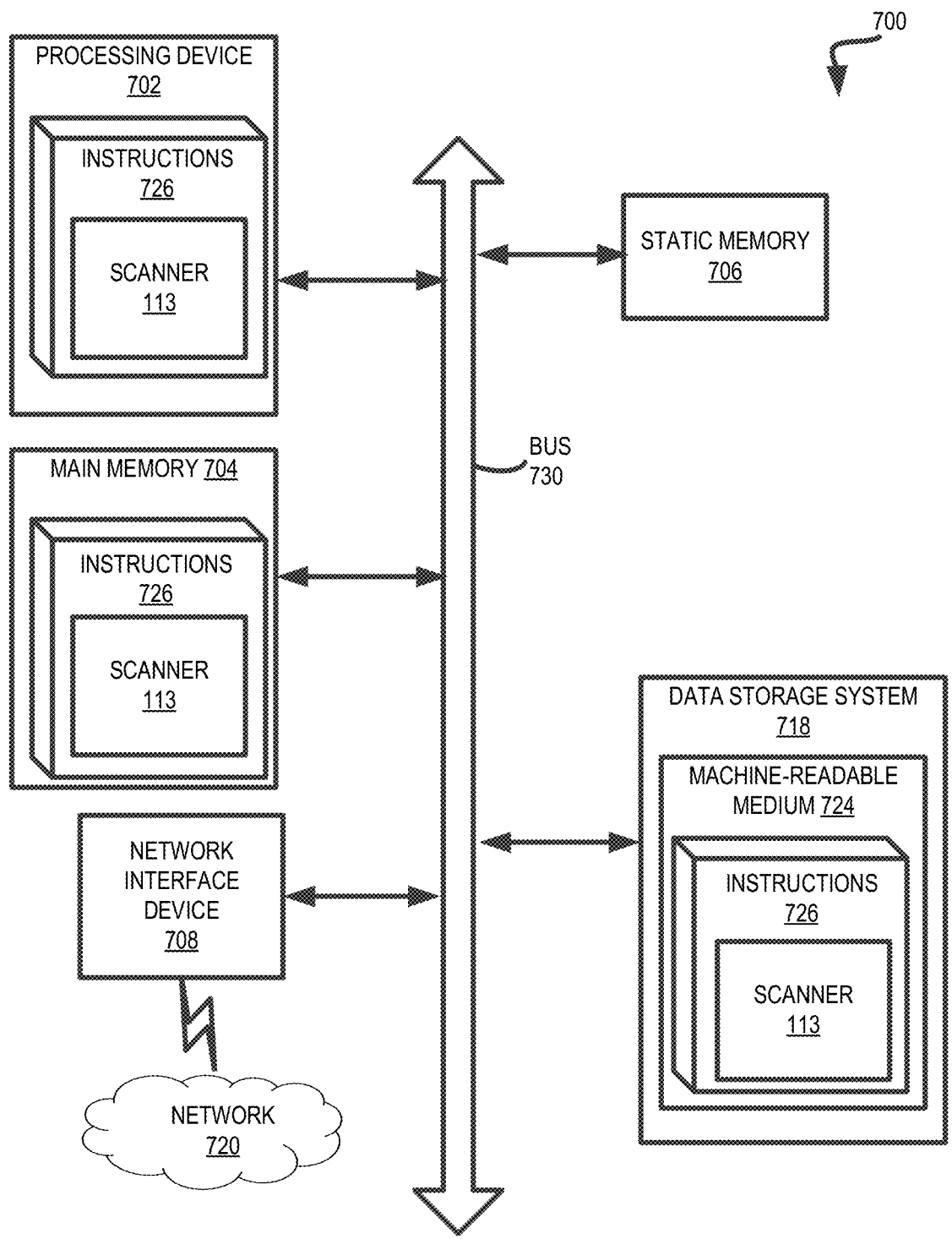
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the scanner 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 710 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 728 for performing the operations and steps discussed herein. The computer system 700 can further include a network interface device 712 to communicate over the network 720.

The data storage system 718 can include a machine-readable storage medium 724 (also known as a computer-readable medium) on which is stored one or more sets of instructions 728 or software embodying any one or more of the methodologies or functions described herein. The instructions 728 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a scanner (e.g., the scanner 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory array comprising a plurality of sub-blocks, each sub-block of the plurality of sub-blocks comprising groups of memory cells; and
a processing device, operatively coupled with the memory array, the processing device to perform operations comprising:
performing, after a wordline is programmed through the plurality of sub-blocks, scanning of the wordline, wherein the scanning comprises:
selecting, to sample first data of the wordline, a first group of the groups of memory cells of a first sub-block of the plurality of sub-blocks;
selecting, to sample second data of the wordline, a second group of the groups of memory cells of a second sub-block of the plurality of sub-blocks;
concurrently reading the first data from the first group and the second data from the second group of the groups of memory cells; and
performing an error check of the wordline using the first data and the second data.

2. The system of claim 1, wherein the second group is sequentially numbered after the first group of the groups of memory cells.

3. The system of claim 1, wherein the operations for scanning the wordline further comprise:
selecting, to sample third data of the wordline, a third group of the groups of memory cells of a third sub-block of the plurality of sub-blocks;
selecting, to sample fourth data of the wordline, a fourth group of the groups of memory cells of a fourth sub-block of the plurality of sub-blocks; and
concurrently reading the first data, the second data, the third data, and the fourth data; and
performing the error check of the wordline using the first data, the second data, the third data, and the fourth data.

4. The system of claim 3, wherein each sub-block of the plurality of sub-blocks comprises a page of data, and wherein the first data, the second data, the third data, and the fourth data comprises a page of data.

5. The system of claim 3, wherein the groups of memory cells of each sub-block of the plurality of sub-blocks comprises a first group, a second group, a third group, and a fourth group of memory cells that are each sequentially numbered.

6. The system of claim 1, wherein the operations further comprise taking a corrective action in response to detecting a defect in the wordline based on results of the error check.

7. A method comprising:
performing, after a wordline is programmed through a plurality of sub-blocks of a memory array, scanning of the wordline, wherein the scanning comprises:
selecting, to sample first data of the wordline, a first group of groups of memory cells of a first sub-block of the plurality of sub-blocks;
selecting, to sample second data of the wordline, a second group of the groups of memory cells of a second sub-block of the plurality of sub-blocks;
concurrently reading the first data from the first group and the second data from the second group of the groups of memory cells; and
performing an error check of the wordline using the first data and the second data.

8. The method of claim 7, wherein the second group is sequentially numbered after the first group of the groups of memory cells.

9. The method of claim 7, further comprising:
selecting, to sample third data of the wordline, a third group of the groups of memory cells of a third sub-block of the plurality of sub-blocks;
selecting, to sample fourth data of the wordline, a fourth group of the groups of memory cells of a fourth sub-block of the plurality of sub-blocks; and
concurrently reading the first data, the second data, the third data, and the fourth data; and
performing the error check of the wordline using the first data, the second data, the third data, and the fourth data.

10. The method of claim 9, wherein each sub-block of the plurality of sub-blocks comprises a page of data, and wherein the first data, the second data, the third data, and the fourth data comprises a page of data.

11. The method of claim 9, wherein the groups of memory cells of each sub-block of the plurality of sub-blocks comprises a first group, a second group, a third group, and a fourth group of memory cells that are each sequentially numbered.

12. The method of claim 7, further comprising taking a corrective action in response to detecting a defect in the wordline based on results of the error check.

13. A non-transitory computer-readable storage medium storing instructions, which when executed by a processing device of a memory sub-system, cause the processing device to perform operations comprising:
performing, after a wordline is programmed through a plurality of sub-blocks of a memory array, scanning of the wordline, wherein the scanning comprises:
selecting, to sample first data of the wordline, a first group of groups of memory cells of a first sub-block of the plurality of sub-blocks;
selecting, to sample second data of the wordline, a second group of the groups of memory cells of a second sub-block of the plurality of sub-blocks;
concurrently reading the first data from the first group and the second data from the second group of the groups of memory cells; and
performing an error check of the wordline using the first data and the second data.

14. The non-transitory computer-readable storage medium of claim 13, wherein the second group is sequentially numbered after the first group of the groups of memory cells.

15. The non-transitory computer-readable storage medium of claim 13, wherein the operations for scanning the wordline further comprise:
selecting, to sample third data of the wordline, a third group of the groups of memory cells of a third sub-block of the plurality of sub-blocks;
selecting, to sample fourth data of the wordline, a fourth group of the groups of memory cells of a fourth sub-block of the plurality of sub-blocks; and
concurrently reading the first data, the second data, the third data, and the fourth data; and performing the error check of the wordline using the first data, the second data, the third data, and the fourth data.

16. The non-transitory computer-readable storage medium of claim 15, wherein each sub-block of the plurality of sub-blocks comprises a page of data, and wherein the first data, the second data, the third data, and the fourth data comprises a page of data.

17. The non-transitory computer-readable storage medium of claim 15, wherein the groups of memory cells of each sub-block of the plurality of sub-blocks comprises a first group, a second group, a third group, and a fourth group of memory cells that are each sequentially numbered.

18. The non-transitory computer-readable storage medium of claim 13, wherein the operations further comprise taking a corrective action in response to detecting a defect in the wordline based on results of the error check.

* * * * *